(12) United States Patent
Galatage et al.

(10) Patent No.: US 9,484,449 B2
(45) Date of Patent: Nov. 1, 2016

(54) INTEGRATED CIRCUITS WITH DIFFUSION BARRIER LAYERS AND PROCESSES FOR PREPARING INTEGRATED CIRCUITS INCLUDING DIFFUSION BARRIER LAYERS

(71) Applicant: GLOBALFOUNDRIES, Inc., Grand Cayman (KY)

(72) Inventors: Rohit Galatage, Clifton Park, NY (US); Hoon Kim, Clifton Park, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/467,357

(22) Filed: Aug. 25, 2014

(65) Prior Publication Data

US 2016/0056253 A1    Feb. 25, 2016

(51) Int. Cl.
*H01L 29/78* (2006.01)
*H01L 21/283* (2006.01)
*H01L 21/28* (2006.01)
*H01L 29/51* (2006.01)
*H01L 29/165* (2006.01)

(52) U.S. Cl.
CPC ............ *H01L 29/78* (2013.01); *H01L 21/283* (2013.01); *H01L 21/28158* (2013.01); *H01L 21/28255* (2013.01); *H01L 29/165* (2013.01); *H01L 29/513* (2013.01); *H01L 29/517* (2013.01)

(58) Field of Classification Search
CPC ....... H01L 28/91; H01L 28/40; H01L 29/78; H01L 21/28158; H01L 29/513; H01L 21/28255; H01L 29/517; H01L 29/165; H01L 21/283
See application file for complete search history.

(56) References Cited

U.S. PATENT DOCUMENTS

| | | | |
|---|---|---|---|
| 2008/0078987 A1* | 4/2008 | Leusink | ........................ 257/19 |
| 2015/0179657 A1* | 6/2015 | Inumiya | ....................... 257/295 |
| 2015/0310905 A1* | 10/2015 | Karda | .................. G11C 11/223 365/185.03 |

OTHER PUBLICATIONS

Lee et al. "Oxygen Potential Engineering of Interfacial Layer for Deep Sub-nm EOT High-k Gate Stacks on Ge", Electron Devices Meeting (IEDM), 2013 IEEE International, pp. 2.5.1-2.5.4.

* cited by examiner

*Primary Examiner* — John P Dulka
*Assistant Examiner* — Charles R Peters
(74) *Attorney, Agent, or Firm* — Lorenz & Kopf, LLP

(57) ABSTRACT

Integrated circuits with a diffusion barrier layers, and processes for preparing integrated circuits including diffusion barrier layers are provided herein. An exemplary integrated circuit includes a semiconductor substrate comprising a semiconductor material, a compound gate dielectric overlying the semiconductor substrate, and a gate electrode overlying the compound gate dielectric. In this embodiment, the compound gate dielectric includes a first dielectric layer, a diffusion barrier layer overlying the first dielectric layer; and a second dielectric layer overlying the diffusion barrier layer; wherein the diffusion barrier layer is made of a material that is less susceptible to diffusion of the semiconductor material than the first dielectric layer, less susceptible to diffusion of oxygen than the second dielectric layer, or both.

13 Claims, 1 Drawing Sheet

US 9,484,449 B2

INTEGRATED CIRCUITS WITH DIFFUSION BARRIER LAYERS AND PROCESSES FOR PREPARING INTEGRATED CIRCUITS INCLUDING DIFFUSION BARRIER LAYERS

TECHNICAL FIELD

The technical field generally relates to integrated circuits and processes for preparing integrated circuits. More particularly, the technical field relates to integrated circuits with diffusion barrier layers in gate dielectrics, and processes for preparing integrated circuits including diffusion barrier layers in gate dielectrics.

BACKGROUND

Metal oxide semiconductor (MOS) transistors find wide-ranging use in electronic devices, such as microprocessors, microcontrollers, and application-specific integrated circuits. MOS transistors generally include a gate electrode formed above a semiconductor substrate, with the gate electrode being insulated from the semiconductor substrate by a thin layer of gate insulator material (i.e., a gate dielectric). A source and a drain are spaced apart regions of either N-type or P-type semiconductor material and are generally embedded within the semiconductor substrate adjacent to the gate electrode on either side thereof. A region in the semiconductor substrate between the source and the drain, and beneath the gate electrode, forms a channel of the MOS transistor.

For years, silicon has been a conventional semiconductor material for use as the channel of a MOS transistor. However, as transistor size decreases, it is increasingly desirable for channel materials to have improved carrier mobility. Two materials with improved carrier mobility relative to relaxed silicon are germanium (Ge) and silicon germanium (SiGe) with a high germanium content. Compound gate insulators that include a dielectric layer of germanium oxide ($GeO_x$) or silicon germanium oxide ($SiGeO_x$), and a layer of a high k-dielectric material, such as hafnium dioxide ($HfO_2$) have been suggested for use with these materials. Unfortunately, devices of this configuration suffer from instability arising from Ge diffusion into the $HfO_2$ layer, and O diffusion into the Ge or SeGe layer, both of which increase gate leakage and lead to premature device failure.

Accordingly, it is desirable to provide novel semiconductor devices with a barrier layer to diminish Ge and O diffusion. It is also desirable to provide processes for preparing such devices. Furthermore, other desirable features and characteristics will become apparent from the subsequent detailed description and the appended claims, taken in conjunction with the accompanying drawings and this background.

BRIEF SUMMARY

Integrated circuits with compound gate dielectrics including a diffusion barrier layer and processes for preparing integrated circuits with compound gate dielectrics including a diffusion barrier layer are provided herein. In an embodiment, an integrated circuit includes a semiconductor substrate comprising a semiconductor material, a compound gate dielectric, and a gate electrode overlying the compound gate dielectric. In this embodiment, the compound gate dielectric includes a first dielectric layer overlying the semiconductor substrate, a diffusion barrier layer overlying the first dielectric layer, and a second dielectric layer overlying the diffusion barrier layer. The diffusion barrier layer is a material that is less susceptible to diffusion of the semiconductor material than the first dielectric layer, less susceptible to diffusion of oxygen than the second dielectric layer, or both.

In another embodiment, an integrated circuit includes a semiconductor substrate comprising a semiconductor material, a compound gate dielectric, and a gate electrode overlying the compound gate dielectric. In this embodiment, the semiconductor material includes germanium and silicon with a mole ratio of germanium to silicon of equal to or greater than about 5:5, or the semiconductor material includes germanium and about 0 mol % to about 1 mol % silicon. The compound gate dielectric includes a first dielectric layer overlying the semiconductor substrate, a diffusion barrier layer overlying the first dielectric layer, and a second dielectric layer overlying the diffusion barrier layer. The diffusion barrier layer includes yttrium oxide, and the second dielectric layer includes a hafnium-based high-k dielectric material.

In another embodiment, a process for preparing an integrated circuit with a compound gate dielectric comprising a diffusion barrier layer is provided. The process includes providing a semiconductor substrate comprising a semiconductor material, depositing a compound gate dielectric, and forming a gate electrode overlying the compound gate dielectric. In this embodiment, depositing a compound gate dielectric includes depositing or growing a first dielectric layer overlying the semiconductor substrate, depositing a diffusion barrier layer overlying the first dielectric material, and depositing a second dielectric layer overlying the diffusion barrier layer. In this embodiment, the diffusion barrier layer is a material that is less susceptible to diffusion of the semiconductor material than the first dielectric layer, less susceptible to diffusion of oxygen than the second dielectric layer, or both.

BRIEF DESCRIPTION OF THE DRAWINGS

Integrated circuits with diffusion barrier layers and processes for preparing integrated circuits with compound gate dielectrics including diffusion barrier layers will hereinafter be described in conjunction with the following drawing figures, wherein like numerals denote like elements, and wherein.

DETAILED DESCRIPTION

Figure 1:
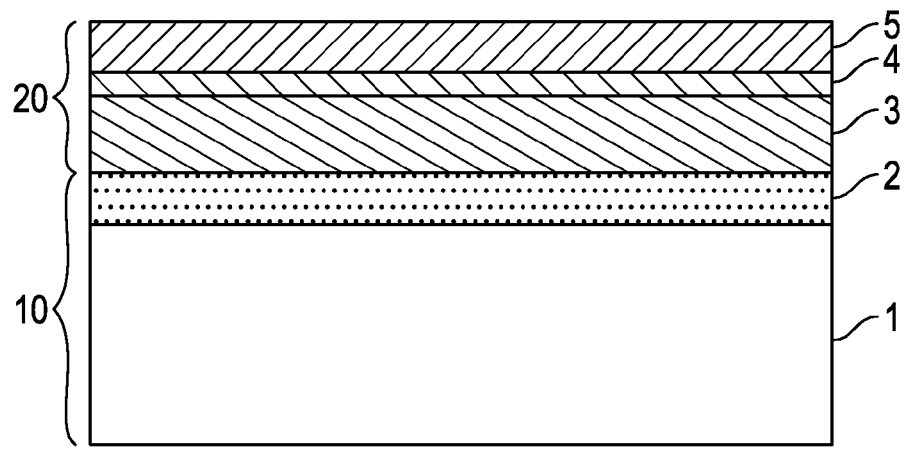
FIG. 1 illustrates, in cross section, a semiconductor substrate and a compound dielectric in accordance with an exemplary embodiment.

The following detailed description is merely exemplary in nature and is not intended to limit the integrated circuits with compound gate dielectrics including diffusion barrier layers and processes for preparing integrated circuits with compound gate dielectrics including diffusion barrier layers claimed herein. Furthermore, there is no intention to be bound by any theory presented in the preceding background or the following detailed description.

Integrated circuits with a diffusion barrier layer and processes for preparing integrated circuits including a diffusion barrier layer are provided herein. In particular, exemplary integrated circuits formed in accordance with the methods that are described herein include a semiconductor substrate, a source region and a drain region disposed in the semiconductor substrate, a channel region defined between the source region and the drain region in the semiconductor substrate, a compound gate dielectric overlying the channel region, and a gate electrode structure overlying the compound gate dielectric. As used herein, the term "overlying" is used to encompass both "over" and "on". In this regard, one feature that overlies a second feature may include intervening features, such as a layer, interposed between the one feature and the second feature within the scope of the term "overlying". Alternatively, the one feature may be formed directly on a surface of the second feature within the scope of the term "overlying."

In the integrated circuits described herein, the compound gate dielectric includes a plurality of layers of dielectric materials, wherein one of the dielectric material layers is a diffusion barrier layer. This diffusion barrier layer inhibits diffusion of semiconductor substrate material from the underlying substrate into an overlying dielectric material layer and/or inhibits diffusion of oxygen (O) from an overlying dielectric material layer into the underlying semiconductor substrate. Such diffusion barrier layers are particularly useful in semiconductor devices with substrate materials with a high degree of mobility, such as those comprising a high proportion of germanium, and/or with semiconductor devices with certain overlying high-k dielectric materials susceptible to undesirable levels of oxygen diffusion.

As used herein, the term "high-k dielectric" refers to a material which has a dielectric constant which is larger than that of conventional $SiO_2$ gate oxide, and more specifically an insulation constant (permittivity) which is about 4 to about 100. Exemplary high-k dielectric materials include certain binary metal oxides such as aluminum oxide, hafnium oxide, zirconium oxide, titanium oxide, lanthanum oxide, yttrium oxide, gadolinium oxide, tantalum oxide, and their silicates and aluminates.

A portion of an exemplary integrated circuit will now be described with reference to FIG. 1. A semiconductor substrate 10 including a first semiconductor material is provided. The first semiconductor material may be any semiconductor material that is known for industrial use in electronic devices. Examples of the first semiconductor material include, but are not limited to, those chosen from silicon (Si), silicon germanium (SiGe), germanium (Ge), gallium arsenide (GaAs), or indium phosphide (InP). The first semiconductor material may be substantially pure, i.e., dopants and/or impurities may be present in amounts of less than or equal to 1 mol % based upon molar composition of the semiconductor substrate 10 and are desirably absent from the semiconductor substrate 10. In alternate embodiments, the first semiconductor material may contain one or more dopant materials which may be introduced into the first semiconductor material via conventional methods in any desirable amount.

In some embodiments, the first semiconductor material contains germanium, and in particular has a mole ratio of germanium to silicon of at least 5:5, such as at least about 7:3. In an exemplary embodiment the first semiconductor material is germanium, and the germanium is present in an amount of about 95 to about 100 mol %, such as about 99 to about 100 mol %, based upon molar composition of the semiconductor substrate 10. In this embodiment, silicon is effectively absent from the semiconductor substrate 10 (i.e., the semiconductor substrate comprises about 0 to about 1 mol % silicon). In another exemplary embodiment, the first semiconductor material is silicon germanium with a high germanium content, with the silicon germanium material present in an amount of about 95 to about 100 mol %, such as about 99 to about 100 mol %, based upon molar composition of the semiconductor substrate 10. In such a material, the mole ratio of germanium to silicon is at least about 5:5, such as at least about 7:3. Both of these exemplary embodiments contain high proportions of germanium, and are typically susceptible to diffusion of germanium from the first semiconductor material into an overlying gate dielectric, resulting in an increase in gate leakage and decrease in the dielectric constant of the gate dielectric.

In some embodiments and as seen in FIG. 1, the semiconductor substrate 10 may include a plurality of semiconductor material layers selected such that an uppermost semiconductor layer 2 contains a high proportion of germanium as described above. In these embodiments, a second semiconductor substrate layer 1 lying below the uppermost semiconductor layer 2 may be any semiconductor material that is known for industrial use in electronic devices, including those listed above, and especially including doped or substantially pure silicon. For instance, in some embodiments, the semiconductor substrate may be a layer 1 of silicon overlaid with a layer 2 of germanium or silicon germanium as described above. Such layered semiconductors substrates are known and may be prepared by any conventional route.

The integrated circuits described herein have a compound gate dielectric 20 overlying and in contact with the semiconductor substrate 10. The compound gate dielectric 20 includes a plurality of dielectric material layers, with one of the dielectric material layers being a diffusion barrier layer 4. In some embodiments, the plurality of layers in the compound gate dielectric 20 includes a first dielectric layer 3, overlaid by a diffusion barrier layer 4, overlaid by a second dielectric layer 5.

The first dielectric layer 3 may be any dielectric material conventionally used as a gate dielectric material. For instance, in embodiments where the semiconductor substrate 10 is a single layer, the first dielectric layer 3 may be an oxide of the semiconductor substrate 10. In alternative embodiments where the semiconductor substrate 10 includes a plurality of layers, the first dielectric layer 3 may be an oxide of a material contained in the uppermost semiconductor layer 2 of the semiconductor substrate 10. For instance, in embodiments where the semiconductor substrate 10 includes a plurality of semiconductor layers with an uppermost semiconductor layer 2 containing substantially pure or doped germanium, the first dielectric layer 3 may be germanium oxide ($GeO_x$). Similarly, in embodiments where the semiconductor substrate 10 includes a plurality of semiconductor layers with an uppermost semiconductor layer 2 containing substantially pure or doped silicon germanium, the first dielectric layer 3 may be silicon germanium oxide ($SiGeO_x$). As used herein, the term "substantially pure" is intended to indicate that a material contains dopants and/or impurities present in amounts of less than or equal to about 1 mol % based upon molar composition of the material.

The diffusion barrier layer 4 is positioned within the compound gate dielectric 20 such that it overlies the first dielectric layer 3 and is made of a material that is resistant to the diffusion of a semiconductor material present in the underlying semiconductor substrate 10 and/or oxygen. In some embodiments, the diffusion barrier layer 4 is overlying and in contact with the first dielectric layer 3. In such embodiments, suitable diffusion barrier layer materials are more resistant to diffusion of an underlying semiconductor material and/or oxygen than the first dielectric layer 3. In some embodiments, the diffusion barrier layer 4 is a dielectric material with a higher dielectric constant (i.e., k value) than the underlying first dielectric layer 3. Exemplary materials suitable for use as a diffusion barrier layer 4 include substantially pure or doped yttrium oxide ($Y_2O_3$).

The second dielectric layer 5 may be any dielectric material suitable for use as a gate dielectric material, including any dielectric material conventionally used as a gate dielectric. As indicated above, the second dielectric layer 5 overlies the diffusion barrier layer 4 in the compound gate dielectric 20. In some specific embodiments, the second dielectric layer 5 is overlying and in contact with the diffusion barrier layer 4. In some embodiments, the second dielectric layer 5 is a substantially pure or doped high-k dielectric material. In some embodiments, the high-k dielectric material comprises a substantially pure or doped hafnium (Hf)-based dielectric material. In some specific embodiments, the second dielectric layer 5 is substantially pure or doped hafnium oxide ($HfO_2$).

In some particular embodiments, the material of the second dielectric layer 5 may be substantially pure. In alternate embodiments, the second dielectric layer 5 may contain one or more dopant materials which may be introduced into the second dielectric layer 5 via conventional methods in any desirable amount. In some related embodiments, the second dielectric layer 5 may be doped with one or more of yttrium, lanthanum, aluminum, ruthenium, and/or zirconium. In some embodiments, specific dopant materials and amounts may be selected such that gate leakage of the integrated circuit device is further diminished.

The integrated circuits described herein further contain at least one P-type or N-type gate electrode structure (not shown in FIG. 1) that overlies the compound gate dielectric 20. A gate electrode structure may be part of a metal-oxide-semiconductor (MOS) transistor device that is formed on the semiconductor substrate 10. Although the term 'MOS transistor device' properly refers to a device having a metal gate electrode and an oxide gate insulator, that term is used herein to refer to any semiconductor device that includes a conductive gate electrode structure (whether metal or other conductive material) that is positioned overlying a compound gate dielectric 20 (whether oxide or other insulator) which, in turn, is positioned overlying the semiconductor substrate 10. The gate electrode structure may be formed through any conventional technique, and may be formed from conventional materials including titanium nitride, aluminum, tungsten, copper, silver, and doped or undoped polycrystalline silicon.

In accordance with FIGS. 1 and 2, an exemplary embodiment of a process for preparing an integrated circuit with a compound gate dielectric 20 that includes a diffusion barrier layer 4 will now be described. The discussion that follows recites specific materials for a semiconductor substrate, first dielectric layer, diffusion barrier layer, and second dielectric layer. However, these specific materials are merely exemplary. That is, the process is not intended to be limited to these specific materials.

In an exemplary embodiment, a semiconductor substrate 10 with at least an upper surface layer 2 made of silicon germanium with a mole ratio of germanium to silicon of at least 7:3 or germanium and about 0 to about 1 mol % silicon (i.e., a high-germanium semiconductor material) is provided. In some embodiments, an upper surface of the semiconductor substrate is subjected to surface cleaning by any suitable wet or dry chemistry to remove any native oxide or organic contaminants that may be present. In some embodiments, surface cleaning is conducted via a dry chemistry process such as chemical oxide removal (COR) dry plasma etch, or silicon cobalt nitride (SiCoNi) dry plasma etch.

A compound gate dielectric 20 comprising a plurality of layers is prepared on the high-germanium surface of the semiconductor substrate 10. The first layer in the compound dielectric is a first dielectric layer 3 that overlies and is in contact with a surface of the high-germanium substrate layer 2. In some embodiments, the first dielectric layer 3 may be grown or deposited by any suitable conventional means according to the desired composition of the first dielectric layer 3. In some embodiments, the first dielectric layer 3 is an oxide of the high-germanium semiconductor material found in the upper substrate layer 2. In these embodiments, the first dielectric layer 3 may be grown by a suitable plasma or wet process to create an oxide layer on the high-germanium surface of the semiconductor substrate 10. In some embodiments, this oxide layer grown or deposited to a thickness of about 0.5 nm to about 1.0 nm.

In this exemplary embodiment, a diffusion barrier layer 4 is then deposited overlying and in contact with the first dielectric layer 3. The diffusion barrier layer 4 may be deposited via any conventional technique suitable for the particular material being deposited. In some embodiments, the diffusion barrier layer 4 at least predominantly contains yttrium oxide. An exemplary diffusion barrier layer 4 may be deposited by atomic layer deposition (ALD). As will be understood by those of skill in the art, ALD is a technique that uses repeated cycles of exposure of precursors to deposit a layer on a surface. In some embodiments, a yttrium oxide diffusion barrier layer 4 is deposited via ALD with any suitable precursor over about 5 to about 10 cycles and at about 100° C. to about 400° C. In some embodiments, the diffusion barrier layer 4 is deposited to a thickness of about 0.5 nm to about 1.0 nm.

A second dielectric layer 5 is then deposited overlying and in contact with the diffusion barrier layer 4. In some embodiments, the second dielectric layer 5 is made of a high-k dielectric material, such as a hafnium-based dielectric material. The second dielectric layer 5 may be deposited via any conventional technique suitable for the particular material being deposited. In a particular embodiment, the second dielectric layer 5 is a substantially pure or doped hafnium oxide material. An exemplary second dielectric layer 5 is deposited by ALD with any suitable precursor over about 15 to about 40 cycles and at about 100° C. to about 400° C. In some embodiments, the second dielectric layer 5 is deposited to a thickness of about 1.7 nm to about 3.0 nm.

As indicated above, in some embodiments the second dielectric layer 5 is a substantially pure high-k dielectric material. In some alternate embodiments, the second dielectric layer 5 is a doped high-k dielectric material. In embodiments where the second dielectric layer 5 is deposited via ALD, dopant materials may be introduced with appropriate dopant precursors in one or more cycles of the ALD process. For instance, a yttrium-doped hafnium oxide second dielectric layer 5 may be deposited by initially depositing hafnium oxide with about 1 to about 25 ALD cycles. Then, yttrium oxide may be deposited with about 1 to about 5 ALD cycles. Additional hafnium oxide may then be deposited with an additional about 1 to about 25 ALD cycles. In some embodiments, the doped second dielectric layer 5 is deposited with a total of about 20 to about 40, such as about 25 to about 30, ALD cycles. In some embodiments, the total number of ALD cycles depositing dopant materials is about 1 to about 5.

In a specific embodiment, a yttrium-doped hafnium oxide second dielectric layer 5 is deposited with an ALD sequence of about 18 to about 23 hafnium cycles, followed by about 1 to about 5 yttrium cycles, followed by about 3 to about 7 hafnium cycles. In an alternate specific embodiment, a yttrium-doped hafnium oxide second dielectric layer 5 is deposited with an ALD sequence of about 3 to about 7 hafnium cycles, followed by about 1 to about 5 yttrium cycles, followed by about 18 to about 23 hafnium cycles. In an alternate specific embodiment, a yttrium-doped hafnium oxide second dielectric layer 5 is deposited with an ALD sequence of about 10 to about 15 hafnium cycles, followed by about 1 to about 5 yttrium cycles, followed by about 10 to about 15 hafnium cycles. In an alternate specific embodiment, a yttrium-doped hafnium oxide second dielectric layer 5 is deposited with two iterations of an ALD sequence of about 4 to about 8 hafnium cycles, followed by about 1 to about 3 yttrium cycles, followed by about 4 to about 8 hafnium cycles. In an alternate specific embodiment, a yttrium-doped hafnium oxide second dielectric layer 5 is deposited with three iterations of an ALD sequence of about 1 to about 5 hafnium cycles, followed by about 1 to about 3 yttrium cycles, followed by about 1 to about 5 hafnium cycles.

After the second dielectric layer 5 is deposited, the structure is optionally subjected to post deposition annealing. In some embodiments, the post deposition annealing process is conducted at a temperature of about 600° C. to about 700° C. for a period of time of about 30 seconds.

Figure 2:
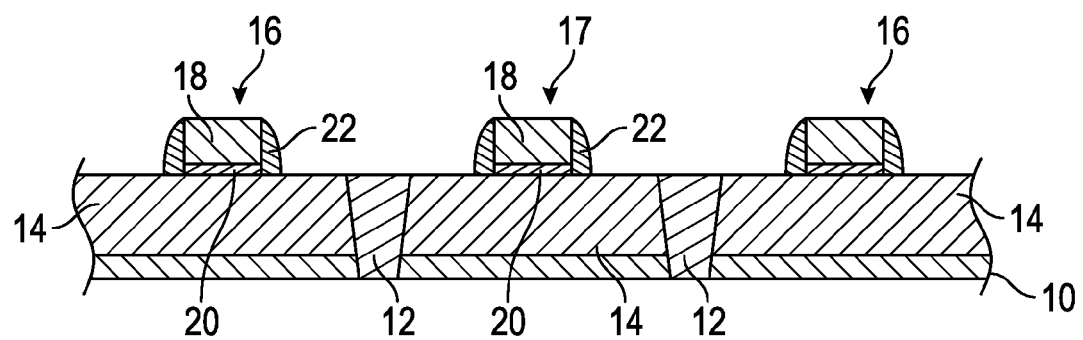
FIG. 2 illustrates, in cross section, part of a method for fabricating a portion of an integrated circuit in accordance with an exemplary embodiment.

In an embodiment and as shown in FIG. 2, shallow trench isolation (STI) structures 12 are formed in the semiconductor substrate 10, and wells 14 are formed in the semiconductor substrate 10 through conventional fabrication techniques. The wells 14 have a dopant concentration, or a concentration of conductivity determining ions, and the conductivity determining ions may be a P-type or N-type conductivity determining ions, depending upon whether a PMOS transistor or NMOS transistor is to be formed. Each well 14 contains opposite conductivity determining ions from the source region and drain region of transistors that are to be formed therein. For example, when the source region and drain region for a transistor include P-type conductivity determining ions, the well 14 includes N-type conductivity determining ions, and vice versa. Typical N-type conductivity determining ions include, but are not limited to, phosphorus, arsenic, antimony, and combinations thereof. Typical P-type conductivity determining ions include, but are not limited to, boron, aluminum, gallium, indium, and combinations thereof.

In an embodiment and also as shown in FIG. 2, two P-type gate electrode structures and an N-type gate electrode structure are formed overlying the semiconductor substrate 10. For illustrative purposes, FIG. 2 shows two P-type gate electrode structures 16 for P-type transistors, and one N-type gate electrode structure 17 for an N-type transistor, although it is to be appreciated that the integrated circuits described herein may include a single P-type gate electrode structure or a plurality of P-type gate electrode structures and a plurality of N-type gate electrode structures. As shown in FIG. 2, each of the gate electrode structures 16, 17 include a gate electrode 18 that overlies a compound gate dielectric 20. The gate electrode structures 16, 17 may be part of a metal-oxide-semiconductor (MOS) transistor device that is formed on the semiconductor substrate 10. Although the term 'MOS transistor device' properly refers to a device having a metal gate electrode and an oxide gate insulator, that term is used herein to refer to any semiconductor device that includes a conductive gate electrode (whether metal or other conductive material) that is positioned overlying a compound gate dielectric 20 as described herein which, in turn, is positioned overlying the semiconductor substrate 10.

The gate electrode structures 16, 17 and further structures overlying the gate electrode structures 16, 17 may be formed through various deposition, masking, and etching techniques in accordance with conventional integrated circuit fabrication. The gate electrode 18 may be formed from conventional materials including copper, silver, and doped or undoped polycrystalline silicon.

Although not shown in FIGS. 1-2, it is to be appreciated that millions of transistors may be formed on the semiconductor substrate 10. In some embodiments, at least one level of interconnect routing may be formed over the transistor(s) on the semiconductor substrate, which is consistent with integrated circuit manufacture. In embodiments with multiple levels of interconnect routing, each level of interconnect routing generally includes a layer of interlayer dielectric material with embedded electrical interconnects disposed therein that can be designed to form complex electrical circuitry that is characteristic of integrated circuits.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration in any way. Rather, the foregoing detailed description will provide those skilled in the art with a convenient road map for implementing an exemplary embodiment. It being understood that various changes may be made in the function and arrangement of elements described in an exemplary embodiment without departing from the scope as set forth in the appended claims.

What is claimed is:

1. An integrated circuit comprising:
    a semiconductor substrate comprising a semiconductor material;
    a compound gate dielectric, comprising:
        a first dielectric layer overlying the semiconductor substrate;
        a diffusion barrier layer overlying the first dielectric layer; and
        a second dielectric layer overlying the diffusion barrier layer, wherein the second dielectric layer comprises a dielectric material that is doped with yttrium, wherein the yttrium is present in an amount of greater than or equal to 15 mol % in the second dielectric layer;
        wherein the diffusion barrier layer comprises a material that is less susceptible to diffusion of the semiconductor material than the first dielectric layer, less susceptible to diffusion of oxygen than the second dielectric layer, or both; and
    a gate electrode overlying the compound gate dielectric.

2. The integrated circuit of claim 1, wherein the semiconductor material of the semiconductor substrate comprises germanium and silicon with a mole ratio of germanium to silicon of equal to or greater than 5:5.

3. The integrated circuit of claim 1, wherein the semiconductor material of the semiconductor substrate comprises germanium and silicon with a mole ratio of germanium to silicon of equal to or greater than 7:3.

4. The integrated circuit of claim 1, wherein the semiconductor material of the semiconductor substrate comprises germanium and 0 mol % to 1 mol % silicon.

5. The integrated circuit of claim 1, wherein the first dielectric layer comprises an oxide of the semiconductor material of the semiconductor substrate.

6. The integrated circuit of claim 1, wherein the diffusion barrier layer comprises doped or substantially pure yttrium oxide.

7. The integrated circuit of claim 1, wherein the diffusion barrier layer and the second dielectric layer have k-values such that the second dielectric layer has a k-value that is higher than the k-value of the diffusion barrier layer.

8. The integrated circuit of claim 1, wherein the dielectric material of the second dielectric layer comprises a hafnium-based dielectric material.

9. An integrated circuit comprising:
a semiconductor substrate comprising a semiconductor material, wherein the semiconductor material comprises germanium and silicon with a mole ratio of germanium to silicon of equal to or greater than 5:5, or the semiconductor material comprises germanium and 0 mol % to 1 mol % silicon;
a compound gate dielectric, comprising:
a first dielectric layer overlying the semiconductor substrate;
a diffusion barrier layer overlying the first dielectric layer, wherein the diffusion barrier layer comprises yttrium oxide; and
a second dielectric layer overlying the diffusion barrier layer, wherein the second dielectric layer comprises a doped hafnium oxide that is doped with yttrium, wherein the yttrium is present in an amount of greater than or equal to 15 mol % in the second dielectric layer;
a gate electrode overlying the compound gate dielectric.

10. A process for preparing an integrated circuit with a compound gate dielectric comprising a diffusion barrier layer, said process comprising:
providing a semiconductor substrate comprising a semiconductor material;
depositing a compound gate dielectric, comprising:
depositing or growing a first dielectric layer overlying the semiconductor substrate;
depositing a diffusion barrier layer overlying the first dielectric layer;
depositing a second dielectric layer overlying the diffusion barrier layer, wherein the second dielectric layer comprises a dielectric material that is doped with lanthanum, yttrium, ruthenium, or a mixture thereof, with the proviso that if yttrium is the dopant, that yttrium is present in an amount of greater than or equal to 9 mol %;
wherein the diffusion barrier layer comprises a material that is less susceptible to diffusion of the semiconductor material than the first dielectric layer, less susceptible to diffusion of oxygen than the second dielectric layer, or both;
forming a gate electrode overlying the compound gate dielectric; and
annealing the first dielectric layer, the diffusion barrier layer, and the second dielectric layer, wherein said annealing is performed at a temperature of 600° C. to 700° C.

11. The process of claim 10, wherein the semiconductor material of the semiconductor substrate comprises germanium and silicon with a mole ratio of germanium to silicon of equal to or greater than 5:5, or germanium and 0 mol % silicon.

12. The process of claim 10, wherein depositing the diffusion barrier layer comprises depositing a layer of doped or substantially pure yttrium oxide.

13. The process of claim 10, wherein depositing the second dielectric layer comprises depositing a layer of high-k dielectric material.

* * * * *